(12) United States Patent
Dalipi

(10) Patent No.: US 8,626,090 B2
(45) Date of Patent: Jan. 7, 2014

(54) CIRCUIT AND METHOD FOR INTERFERENCE REDUCTION

(75) Inventor: Spendim Dalipi, Sollentuna (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 13/634,253

(22) PCT Filed: Mar. 23, 2010

(86) PCT No.: PCT/SE2010/050319
§ 371 (c)(1),
(2), (4) Date: Sep. 12, 2012

(87) PCT Pub. No.: WO2011/119078
PCT Pub. Date: Sep. 29, 2011

(65) Prior Publication Data
US 2013/0005284 A1    Jan. 3, 2013

(51) Int. Cl.
*H04B 1/04* (2006.01)
(52) U.S. Cl.
USPC ............... 455/114.3; 455/114.2; 375/296
(58) Field of Classification Search
USPC ............ 455/114.2–114.3, 91; 375/296, 297
See application file for complete search history.

(56) References Cited

U.S. PATENT DOCUMENTS

| | | | |
|---|---|---|---|
| 5,745,857 A | 4/1998 | Maeng | |
| 6,438,360 B1 | 8/2002 | Alberth, Jr. | |
| 7,092,684 B2 * | 8/2006 | Szopko et al. | 455/114.2 |
| 2002/0084845 A1 | 7/2002 | Eisenberg | |

FOREIGN PATENT DOCUMENTS

EP    1432132 A1    6/2004

* cited by examiner

Primary Examiner — Christian Hannon
(74) Attorney, Agent, or Firm — Murphy, Bilak & Homiller, PLLC

(57) ABSTRACT

A radio frequency transmitter comprises an amplifier, an antenna port, an isolator adapted to isolate an output of the amplifier from an interfering signal of the antenna port, a linearization loop and a transmission line comprising a first part (coupling a signal source to an input of the amplifier), a second part (coupling the output of the amplifier to an input of the isolator) and a third part (coupling an output of the isolator to the antenna port). The linearization loop is adapted to reduce non-linearity of the isolator and comprises a first directional coupler coupled to the third part of the transmission line, a loop impedance, and at least one further linearization loop element adapted to adjust a linearization signal and to feed the adjusted linearization signal to the transmission line. The radio frequency transmitter also comprises an interference reducing circuit adapted to reduce an influence of the interfering signal on the linearization loop. The circuit comprises a variable gain and phase shifter, and second and third directional couplers. The variable gain and phase shifter is coupled to the third part of the transmission line via the second directional coupler, which extracts a compensation signal from the transmission line, and is adapted to adjust amplitude and phase of the compensation signal based on the amplitude and phase of the interfering signal passing through the loop impedance. The third directional coupler couples the variable gain and phase shifter to the loop feed line and feeds the adjusted compensation signal thereto.

15 Claims, 4 Drawing Sheets

CIRCUIT AND METHOD FOR INTERFERENCE REDUCTION

TECHNICAL FIELD

The present invention relates generally to the field of interference reduction in radio frequency transmitter circuits.

BACKGROUND

In general, performance requirements of radio frequency (RF) transmitter circuits may be high and may concern e.g. noise generation, susceptibility to outside interference, linearity in the operational range, etc. The radio frequency performance requirements of a multi-carrier transmitter are generally extremely high. To meet such requirements various solutions may be utilized (alone or in combination).

For example, to have a possibility to meet requirements on linearity, the output power amplifier (PA) may need to be linearized (e.g. by means of a linearization loop).

Furthermore, to have a possibility to meet requirements on susceptibility to interference, the PA and the linearization loop may need to be shielded/isolated from interfering signals of the antenna port (e.g. signals picked up by the antenna and/or internal signals reflected at the antenna port).

One possible solution to the problem of isolating the PA is to place a (single or double) circulator between the PA output and the antenna port as exemplified in EP 1432132 A1 and in U.S. Pat. No. 7,092,684 B2.

One problem with such solutions is that inter-modulation (IM) distortion generated by or associated with the circulator (s) cannot be handled by the linearization loop.

Nevertheless, such solutions fill their purpose well enough for single carrier transmitters. Single carrier transmitters typically have high PA-efficiency and any inter-modulation (IM) distortion in such transmitters is typically associated with the circulator(s). However, the inter-modulation distortion is not a serious issue for such transmitters since it worsens only the spectrum mask, the requirements of which are typically not difficult to fulfill.

In multi-carrier (MC) transmitters, however, peaks of the inter-modulation distortion will not only fold close to the respective carriers but also to frequencies that equal any multiple of the carrier spacing. Thus, the inter-modulation distortion is a serious issue for such transmitters, and need to be dealt with if it should be possible to fulfill the performance requirements.

Therefore, there is a need for improved circuits and methods that reduce interference and/or improve linearity in radio frequency transmitter circuits.

SUMMARY

It should be emphasized that the term "comprises/comprising" when used in this specification is taken to specify the presence of stated features, integers, steps, or components, but does not preclude the presence or addition of one or more other features, integers, steps, components, or groups thereof.

It is an object of the invention to obviate at least some of the above disadvantages and to provide improved circuits and methods that reduce interference and/or improve linearity in radio frequency transmitter circuits.

According to a first aspect of the invention, this is achieved by an interference reducing circuit for a radio frequency transmitter, wherein the radio frequency transmitter comprises an amplifier, an antenna port, an isolator adapted to isolate an output of the amplifier from an interfering signal of the antenna port, a linearization loop adapted to reduce a non-linearity of the isolator, and a transmission line comprising a first part, a second part and a third part.

The first part comprises a first end connectable to a signal source and a second end coupled to an input of the amplifier. The second part comprises a third end coupled to the output of the amplifier and a fourth end coupled to an input of the isolator. The third part comprises a fifth end coupled to an output of the isolator and a sixth end coupled to the antenna port.

The linearization loop comprises a first directional coupler coupled to the third part of the transmission line, a loop impedance coupled at a first port to the first directional coupler, and at least one further linearization loop element coupled to a second port of the loop impedance via a loop feed line and adapted to adjust a linearization signal and to feed the adjusted linearization signal to the transmission line.

The interference reducing circuit is adapted to reduce an influence of the interfering signal of the antenna port on the linearization loop and comprises a second directional coupler adapted to extract a compensation signal from the third part of the transmission line. The interfering reducing circuit also comprises a variable gain and phase shifter coupled at a first port to the third part of the transmission line via the second directional coupler and adapted to adjust an amplitude of the compensation signal to match an amplitude of the interfering signal of the antenna port passing through the loop impedance, and to adjust a phase of the compensation signal to be of opposite phase as the interfering signal of the antenna port passing through the loop impedance. The interfering reducing circuit further comprises a third directional coupler coupling a second port of the variable gain and phase shifter to the loop feed line and adapted to feed the adjusted compensation signal to the loop feed line.

In some embodiments, the first and second directional couplers may comprise a single directional coupler, and the variable gain and phase shifter may be coupled to the third part of the transmission line via an isolation port of the single directional coupler.

In some embodiments, the variable gain and phase shifter may comprise a variable gain shifter and a variable phase shifter coupled in series.

The interference reducing circuit may be for a multi-carrier radio frequency transmitter according to some embodiments.

A second aspect of the invention is a compensation circuit comprising the interference reducing circuit according to the first aspect of the invention and the linearization loop described in connection with the first aspect of the invention.

The linearization loop may be a feed forward loop or a feedback loop.

In some embodiments, the linearization loop may be further adapted to reduce a non-linearity of the amplifier.

A third aspect of the invention is a radio frequency transmitter comprising the compensation circuit according to the second aspect of the invention, and the amplifier, the antenna port, the isolator and the transmission line described in connection with the first aspect of the invention.

The isolator may comprise a circulator.

A fourth aspect of the invention is a communication device comprising the radio frequency transmitter according to the third aspect of the invention. The communication device may, in some embodiments, be a radio base station or a mobile terminal.

A fifth aspect of the invention is an interference reduction method for a radio frequency transmitter, wherein the radio frequency transmitter comprises features identical with or corresponding to any of the various features as explained above for the first aspect of the invention.

The interference reduction method is for reducing an influence of the interfering signal of the antenna port on the linearization loop and comprises extracting a compensation signal from the third transmission line vi a second directional coupler, adjusting an amplitude of the compensation signal to match an amplitude of the interfering signal of the antenna port passing through the loop impedance, adjusting a phase of the compensation signal to be of opposite phase as the interfering signal of the antenna port passing through the loop impedance, and feeding the adjusted compensation signal to the loop feed line via a third directional coupler.

A sixth aspect of the invention is a method of manufacturing a radio frequency transmitter comprising coupling a signal source to an input of an amplifier by means of a first part of a transmission line, and arranging an isolator to isolate an output of the amplifier from an interfering signal of an antenna port by coupling the output of the amplifier to an input of the isolator by means of a second part of the transmission line and coupling an output of the isolator to the antenna port by means of a third part of the transmission line.

The method also comprises arranging a linearization loop to reduce a non-linearity of the isolator by coupling a first directional coupler to the third part of the transmission line, coupling a loop impedance at a first port to the first directional coupler, coupling at least one further linearization loop element to a second port of the loop impedance via a loop feed line, and adapting the at least one further linearization loop element to adjust a linearization signal and to feed the adjusted linearization signal to the transmission line.

Furthermore, the method comprises arranging an interference reducing circuit to reduce an influence of the interfering signal of the antenna port on the linearization loop by adapting a second directional coupler to extract a compensation signal from the third part of the transmission line, coupling a variable gain and phase shifter at a first port to the third part of the transmission line via the second directional coupler, adapting the variable gain and phase shifter to adjust an amplitude of the compensation signal to match an amplitude of the interfering signal of the antenna port passing through the loop impedance and to adjust a phase of the compensation signal to be of opposite phase as the interfering signal of the antenna port passing through the loop impedance, and coupling a second port of the variable gain and phase shifter to the loop feed line by means of a third directional coupler to feed the adjusted compensation signal to the loop feed line.

In some embodiments, the fifth and sixth aspects of the invention may additionally have features identical with or corresponding to any of the various features as explained above for the first, second, or third aspects of the invention.

An advantage of some embodiments of the invention is that linearization of the radio frequency transmitter is provided.

Another advantage of some embodiments of the invention is that distortion generated by the isolator (e.g. circulator) is linearized.

Another advantage of some embodiments of the invention is that the susceptibility to noise associated with an antenna port of the radio frequency transmitter is reduced.

Another advantage of some embodiments of the invention is that combination with a feed forward loop yields better (forward and/or reverse) inter-modulation reduction.

Another advantage of some embodiments of the invention is that a second circulator is not required. This may in turn lower the requirements on the PA output since the path loss of a second circulator (typically 0.25-0.35 dB) need not be compensated for.

BRIEF DESCRIPTION OF THE DRAWINGS

Further objects, features and advantages of the invention will appear from the following detailed description of embodiments of the invention, with reference being made to the accompanying drawings, in which.

DETAILED DESCRIPTION

Figure 1A:
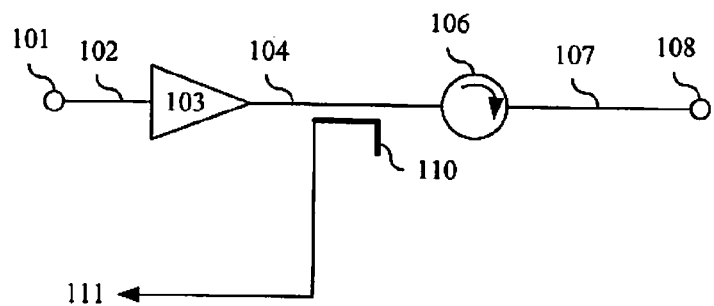
FIG. 1A is a schematic circuit diagram illustrating an example prior art feed-back circuit.

In the following, embodiments of the invention will be described where a linearization loop is applied which includes not only a power amplifier (PA) of a radio frequency (RF) circuit, but also an isolator (e.g. a circulator) applied between the PA and an antenna port of the RF circuit. Thus, the PA is isolated from the antenna port and a linearization loop feed-back coupling point is located after (outside) the isolator according to some embodiments. The linearization may be performed using any suitable known or future linearization method.

It is understood that further elements may, according to some embodiments, also be present between the PA and the antenna port. For example, a filter may be located between the isolator and the antenna port.

To isolate such a linearization loop arrangement from interfering signals associated with the antenna port (or at least minimize the impact of the interfering signals), embodiments of the invention introduce an interference reduction arrangement associated with the linearization loop.

The interference reduction arrangement extracts a compensation signal from signal path between the isolator and the antenna port, adjusts it, and feeds the adjusted compensation signal to the linearization loop signal path.

The adjustment has the purpose of tailoring the compensation signal to cancel or at least reduce the interfering signals in the linearization loop. The adjustment may comprise adjusting the amplitude of the compensation signal to match the amplitude of the interfering signal and adjusting the phase of the compensation signal to be of opposite phase as the interfering signal.

Using embodiments of the invention may have several advantages. For example, the PA is linearized and isolated from the antenna port, the isolator is linearized, and the linearization loop is protected against interfering signals associated with the antenna port.

Interfering signals associated with the antenna port may comprise external interfering signals picked up by the antenna and propagated via the antenna port. Alternatively or additionally, the interfering signals associated with the antenna port may comprise components of internal signals reflected at the antenna port. Other interfering signals associated with the antenna port may also be envisioned.

As has been mentioned above, application of embodiments of the invention is particularly beneficial for multi-carrier radio frequency transmitters. However, it should be noted that embodiments of the invention may be beneficial and are equally applicable also for other types of radio frequency transmitters.

In some embodiments a radio frequency transmitter as describe above may be manufactured by coupling a signal source to the input of the amplifier by means of a first part of a transmission line, coupling the output of the amplifier to the input of the isolator by means of a second part of the transmission line, and coupling the output of the isolator to the antenna port by means of a third part of the transmission line.

In manufacturing a linearization loop may be arranged to at least reduce (and possibly remove) a non-linearity of the isolator (and possibly also of the PA) within an applicable operational range. The arranging of the linearization loop may comprise coupling a directional coupler to the third part of the transmission line to extract a linearization signal, and arranging a loop impedance and/or at least one further linearization loop element so that they may adjust the linearization signal. The linearization loop may also be adapted, in the manufacturing process, to feed the adjusted linearization signal back to the transmission line.

When manufacturing the radio frequency circuit according to some embodiments, an interference reducing circuit is also arranged to reduce an influence of the interfering signal of the antenna port on the linearization loop. Such arranging may include adapting a directional coupler to extract a compensation signal from the third part of the transmission line, coupling a variable gain and phase shifter to the directional coupler and to the loop feed line.

In association with the manufacturing process, the variable gain and phase shifter may also be adapted to adjust the amplitude of the compensation signal to match the amplitude of the interfering signal and to adjust the phase of the compensation signal to be of opposite phase as the interfering signal.

In some embodiments, the variable gain and phase shifter of the interference reduction circuit may be calibrated by use of an injected interferer. The injected interferer may have different characteristic depending on various parameters. For example, the injected interferer has temperature dependent gain and phase. The calibration particulars thus obtained may be stored in association with their corresponding parameters in, for example, a look-up table. Then, the look-up table values, supplemented by relevant parameter values (e.g. measurements of a temperature sensor) may be used to control the variable gain and phase shifter in operation.

In a calibration process with known interference, as described above, the composite signal (comprising both the desired signal and the interference signal) may be correlated with the known interference signal and the result may be observed while parameters of the variable gain and phase shifter are varied. Thus, parameters of the variable gain and phase shifter may be set to reduce (and preferably minimize) the energy of the interfering signal in the compensated signal.

In a calibration process with un-known interference (e.g. if the interference reduction/cancellation needs to be calibrated in real time operation, or if a calibration needs to be updated or fine-tuned in real time), the process is typically more cumbersome and less accurate. One way to achieve calibration in such a situation is to correlate the composite signal with the (known) transmitted signal and set parameters of the variable gain and phase shifter to reduce the energy that is not correlated to the transmitted signal.

FIG. 1A illustrates an example prior art circuit with a feed-back linearization loop. A port 101 for supplying an RF signal is coupled to the input of a PA 103 via the connection 102. The output of the PA 103 is isolated from an antenna port 108 by insertion of a circulator 106 in the connection 104, 107 between the PA 103 and the antenna port 108. The linearization loop connects to the transmission line via a directional coupler 110 to the connection 104, and feeds back the extracted linearization signal as illustrated at 111. Thus, the linearization loop does not operate on the circulator 106 and any non-linearities introduced by the circulator 106 will not be compensated for.

The feed-back linearization loop may, for example, involve digital pre-distortion (DPD) linearization. The feed-back signal illustrated at 111 may be input to further processing circuitry which may, for example, include one or more mixers, one or more intermediate frequency (IF) filters, and an analogue-to-digital converter (ADC). Generally, DPD linearization is a technique for improving linearity of radio transmitter components (such as amplifiers). Typically, the DPD loop inversely models the amplifier's gain and phase characteristics and, when combined with the amplifier, produces an overall system that is closer to linear than is the amplifier alone and thereby reduces the amplifier's distortion. According to embodiments of the invention, any suitable (known or future) DPD linearization method and architecture may be used.

Figure 1B:
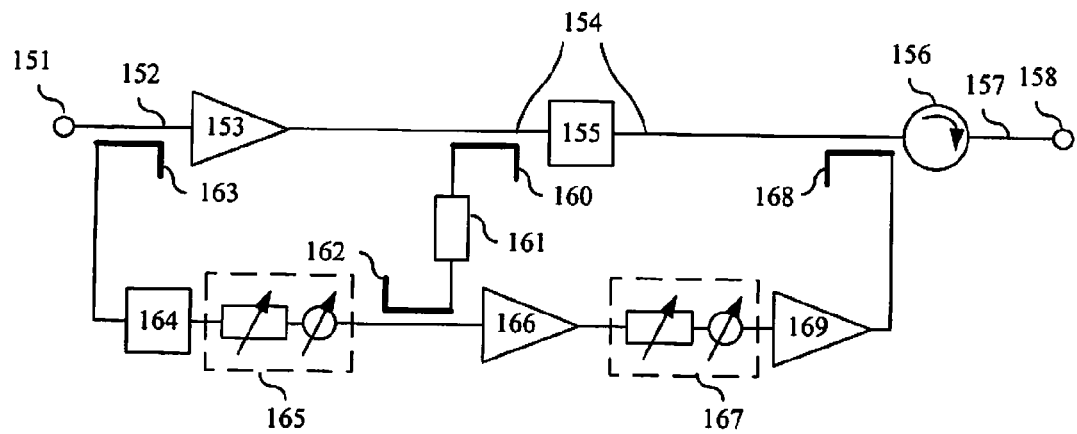
FIG. 1B is a schematic circuit diagram illustrating an example prior art feed forward circuit.

FIG. 1B illustrates an example prior art circuit with a feed forward linearization loop. A port 151 for supplying an RF signal is coupled to the input of a PA 153 via the connection 152. The output of the PA 153 is isolated from an antenna port 158 by insertion of a circulator 156 in the connection 154, 157 between the PA 153 and the antenna port 158. The linearization loop connects to the transmission line via a directional coupler 160 to the connection 154, and via another directional coupler 163 to the connection 152, and feeds forward the processed linearization signal to the connection 154 via yet another directional coupler 168. Thus, the linearization loop does not operate on the circulator 156 and any non-linearities introduced by the circulator 156 will not be compensated for.

In this embodiment, the feed forward linearization loop comprises a delay element 164, variable gain and phase shifters 165 and 167, an impedance 161, a directional coupler 162, an amplifier 166 and an error power amplifier (EPA) 169. The components may be arranged as shown in FIG. 1B. Alternatively, the EPA 168 may be moved to any other suitable location in the linearization line. The EPA amplifies the distortion signal (e.g. vector error) to match the distortion signal to the main path signal, and the variable gain and phase shifters 165, 167 fine-tunes the distortion signal to optimize the subtraction at the directional coupler 168. According to embodiments of the invention, any suitable (known or future) EPA feed forward linearization method and architecture may be used.

The transmission feed line also comprises a delay element 155 in the connection 154, the purpose of which is to match the timing of the transmission line signal to the delay introduced in the linearization signal by the linearization loop. Typically, the delay elements 164 and 155 may be tuned in relation to each other.

Typically, feed forward loops may be very dependent on delay accuracy for adequate operation. If the delay accuracy is poor, the interference cancellation aimed at by the linearization loop may become narrow-banded.

It may be emphasized that FIGS. 1A and 1B are schematic drawings and do not necessarily display all elements of a radio frequency transmitter. For example, a diplex filter and/or RF filter may be associated with the output port (108, 158), whereby it is only necessary to perform compensation in the transmit band since the filter reduces the bandwidth of the interferers. All the interferers outside the RF bandwidth are attenuated significantly in such a scenario, so that they are not causing any problem. Such a feature may, for example, somewhat reduce the requirements of delay accuracy and power handling of the interference cancellation loop. Furthermore, there may be one or several additional amplifiers or gain and phase blocks in the EPA lineup of FIG. 1B. There may also be additional loops, such as control loops to tune the delays, the gain and phase parameters, etc.

Figure 2:
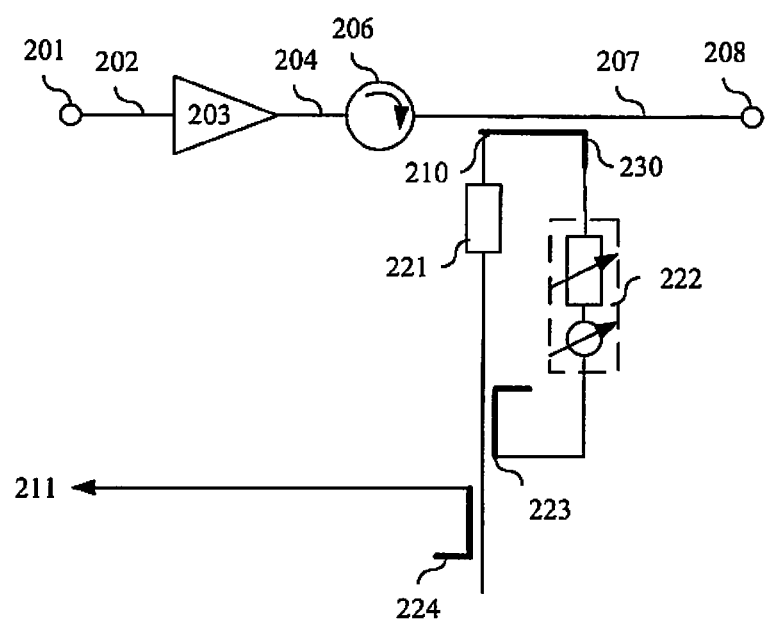
FIG. 2 is a schematic circuit diagram illustrating an example feed-back circuit according to some embodiments of the invention.

FIG. 2 illustrates an example circuit with a feed-back linearization loop according to some embodiments of the invention. FIG. 2 is preferably compared with FIG. 1A. A port 201 for supplying an RF signal is coupled to the input of a PA 203 via the connection 202. The output of the PA 203 is isolated from an antenna port 208 by insertion of a circulator 206 in the connection 204, 207 between the PA 203 and the antenna port 208.

A linearization loop connects to the transmission line via a directional coupler 210 to the connection 207, and feeds back the extracted linearization signal as illustrated at 211. Thus, this linearization loop does operate on the circulator 206 and non-linearities introduced by the circulator 206 may be compensated for.

The directional coupler 210 is connected to an impedance 221, which is in turn coupled to the remainder of the feed-back loop 211 via another directional coupler 224. The remainder of the feed-back loop 211 may, for example, be configured as explained for the feed-back loop 111 of FIG. 1A.

Throughout this specification, when the term impedance or loop impedance is used (see e.g. 161, 221 361 and 391) it is taken to include also the case of an attenuator (which may, for example, be implemented as an impedance network).

Moving the linearization loop to also include the circulator 206 introduces the problem of isolation of the linearization loop itself. In this embodiment, a solution to that problem is provided by coupling of a variable gain and phase shifter 222 to the connection 207 via an isolation port 230 of the directional coupler 210. The variable gain and phase shifter 222 is adapted to adjust a signal drawn from the connection 207 such that, when it is fed to the linearization loop via the directional coupler 223, it cancels (or at least reduces) the interference stemming from the antenna port and experienced by the linearization loop.

The arrangement of FIG. 2 reduces the power in the linearization loop of signals reflected from the antenna or any other point between the circulator 206 and the antenna port 208. The arrangement also reduces the power of an interfering signal, e.g. from a nearby antenna or a co-located transmitter. The loop gain and phase of the reflected signal and interferer may be adjusted in polar or Cartesian domain with the aim that maximum interference cancellation should be obtained. The cancellation can be made at very low power levels to prevent generation of unwanted inter-modulation noise.

Figure 3A:
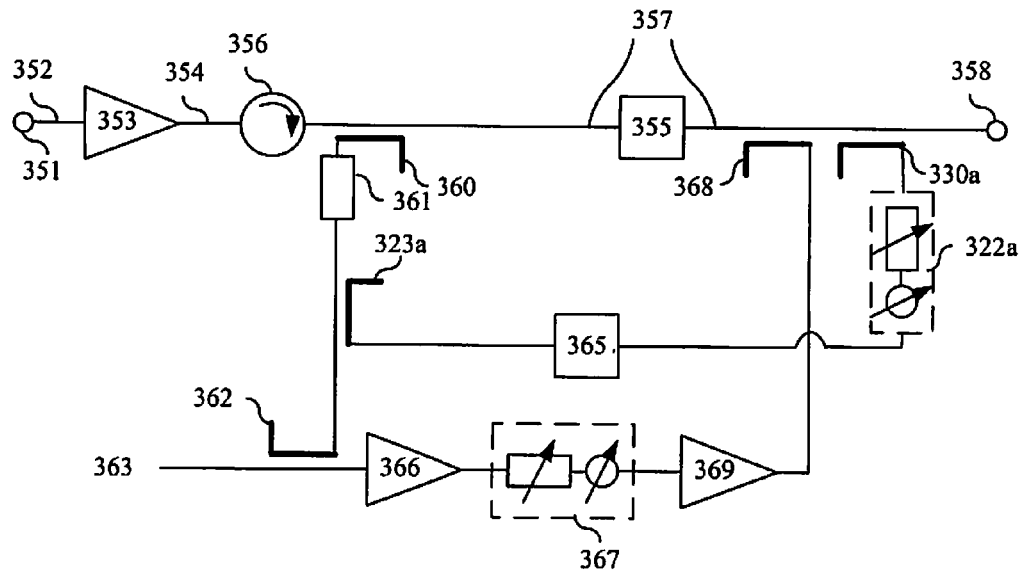
FIGS. 3A and 3B are schematic circuit diagrams illustrating two example feed forward circuits according to some embodiments of the invention.

FIG. 3A illustrates an example circuit with a feed forward linearization loop according to some embodiments of the invention. FIG. 3A is preferably compared with FIG. 1B.

A port 351 for supplying an RF signal is coupled to the input of a PA 353 via the connection 352. The output of the PA 353 is isolated from an antenna port 358 by insertion of a circulator 356 in the connection 354, 357 between the PA 353 and the antenna port 358.

A feed forward linearization loop connects to the transmission line via the directional couplers 360 and 368 to the connection 357. Thus, this linearization loop does operate on the circulator 356 and non-linearities introduced by the circulator 356 may be compensated for. The linearization loop elements 360, 361, 362, 366, 367, 368 and 369 are similar or identical to the linearization loop elements 160, 161, 162, 166, 167, 168 and 169 of FIG. 1B respectively, and will therefore not be described in detail. Furthermore, the loose end 363 may be connected to further suitable linearization loop elements, for example similar to 163, 164 and 165 of FIG. 1B.

Moving the linearization loop to also include the circulator 356 introduces the problem of isolation of the linearization loop itself in the same manner as described above. In this embodiment, a solution to that problem is provided by coupling of a variable gain and phase shifter 322a to the connection 357 via a directional coupler 330a. The variable gain and phase shifter 322a is adapted to adjust a signal drawn from the connection 357 such that, when it is fed to the linearization loop via the directional coupler 323a, it cancels (or at least reduces) the interference stemming from the antenna port and experienced by the linearization loop.

The transmission feed line also comprises a delay element 355 in the connection 357, the purpose of which is to match the timing of the transmission line signal to the delay introduced in the linearization signal by the linearization loop. A delay element 365 is also introduced in association with variable gain and phase shifter 322a to improve the delay matching of the various signal paths. It is emphasized that some or all of these delay elements may be removed and other be inserted at different locations in other embodiments of the invention, as long as the different signal paths are properly delay matched as elaborated on above. Typically, the various delay elements (e.g. 365 and 355) may be tuned in relation to each other. In the example of FIG. 3A, one possible delay requirement may be that the delays along different paths from the coupler 330a to the coupler 323a should be matched (e.g. equal or substantially equal).

Figure 3B:
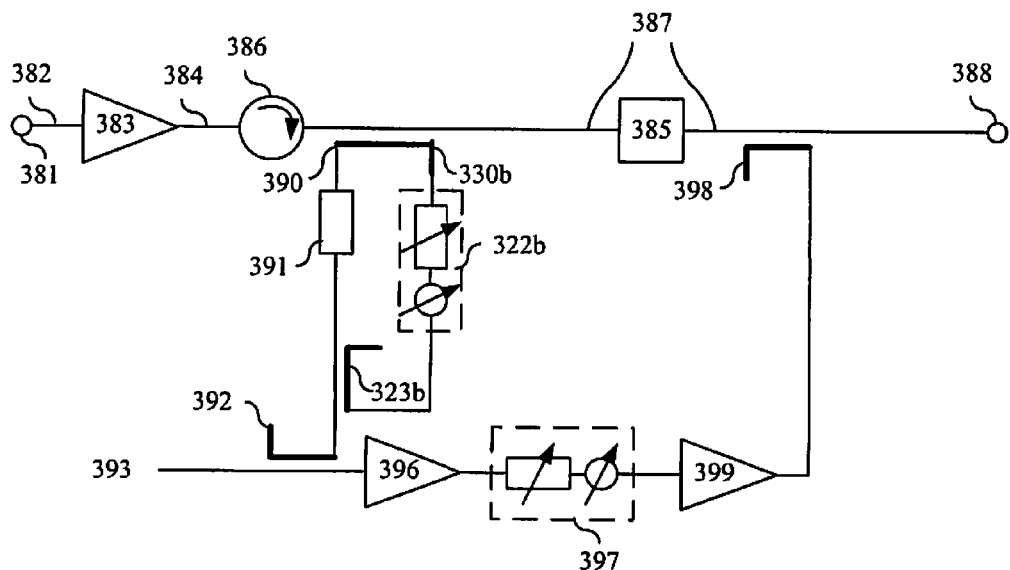

FIG. 3B illustrates another example circuit with a feed forward linearization loop according to some embodiments of the invention. FIG. 3B is also preferably compared with FIG. 1B.

A port 381 for supplying an RF signal is coupled to the input of a PA 383 via the connection 382. The output of the PA 383 is isolated from an antenna port 388 by insertion of a circulator 386 in the connection 384, 387 between the PA 383 and the antenna port 388.

A feed forward linearization loop connects to the transmission line via the directional couplers 390 and 398 to the connection 387. Thus, this linearization loop does operate on the circulator 386 and non-linearities introduced by the circulator 386 may be compensated for. The linearization loop elements 390, 391, 392, 396, 397, 398 and 399 are similar or identical to the linearization loop elements 160, 161, 162, 166, 167, 168 and 169 of FIG. 1B respectively, and will therefore not be described in detail. Furthermore, the loose end 393 may be connected to further suitable linearization loop elements, for example similar to 163, 164 and 165 of FIG. 1B.

Moving the linearization loop to also include the circulator 386 introduces the problem of isolation of the linearization loop itself in the same manner as described above. In this embodiment, a solution to that problem is provided by coupling of a variable gain and phase shifter 322b to the connection 387 via an isolation port 330b of the directional coupler 390. The variable gain and phase shifter 322b is adapted to adjust a signal drawn from the connection 387 such that, when it is fed to the linearization loop via the directional coupler 323b, it cancels (or at least reduces) the interference stemming from the antenna port and experienced by the linearization loop.

The transmission feed line also comprises a delay element 385 in the connection 387, the purpose of which is to match the timing of the transmission line signal to the delay introduced in the linearization signal by the linearization loop. It is emphasized that some delay elements may be removed and other be inserted at different locations in other embodiments of the invention, as long as the different signal paths are properly delay matched as elaborated on above. Typically, the various delay elements may be tuned in relation to each other.

In the embodiments of FIGS. 3A and 3B, inter-modulation interference generated in either or both of the circulator and the EPA may be reduced or cancelled. The EPA may generate inter-modulation interference if, for example, there is a strong interferer signal.

Typically, the loops illustrated in FIGS. 3A and 3B is a last loop of a feed forward linearizer. Thus, in some embodiments, the PA may have been pre-linearized using other linearization techniques and/or with other linearization loops (e.g. other feed forward linearization loops).

Figure 4:
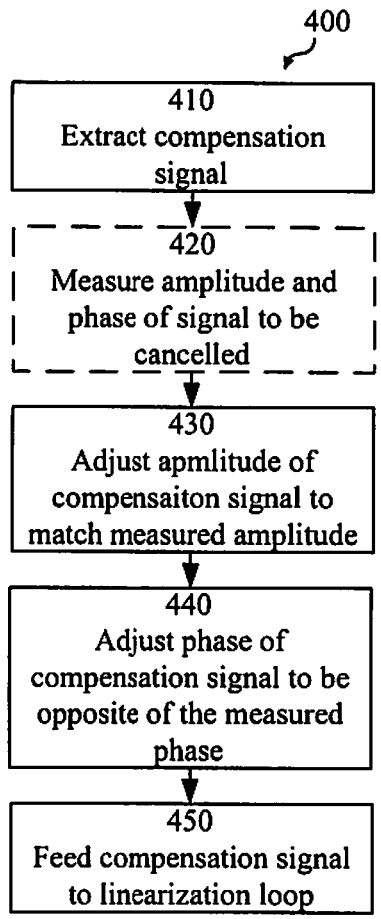
FIG. 4 is a flow diagram illustrating example method steps according to some embodiments of the invention.

FIG. 4 illustrates an example method 400 of reducing interference experienced by a linearization loop of a radio frequency transmitter according to embodiments of the invention.

The method starts in step 410, where a compensation signal is extracted from a main transmission line of the RF transmitter. The signal may, typically, be extracted close to the antenna port and after an isolator applied in the main transmission line.

In optional step 420, the amplitude and phase of the signal to be cancelled are measured. Typically, this is done in a calibration process, which may, for example, be performed in association with manufacturing of the transmitter.

Other measurements may also be performed in association with the calibration process or otherwise after step 410 (even if optional step 420 is not performed). Such other measurements may include temperature measurements.

In steps 430 and 440, the amplitude and phase of the compensation signal are adjusted based on the measurements of step 420 and/or on the other measurements. In some embodiments, the adjustment comprised extracting amplitude and phase information from a look-up table, which may have been configured during an earlier calibration process. The amplitude may be adjusted to match the amplitude of the interfering signal and the phase may be adjusted such that it is of opposite phase as the interfering signal.

Finally, in step 450, the adjusted signal is fed to the linearization loop to cancel or reduce the interference experienced by the loop.

Figure 5A:
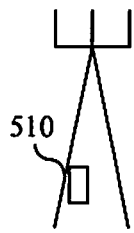
FIG. 5A is a schematic drawing illustrating a base station site, wherein the base station may comprise a circuit according to some embodiments of the invention.

FIG. 5A illustrates a base station 510, which may comprise one or more circuits or perform methods according to embodiments of the invention. For example, the base station 510 may comprise any of the arrangements illustrated in FIGS. 2, 3A and 3B.

Figure 5B:
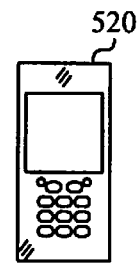
FIG. 5B is a schematic drawing illustrating a mobile terminal, wherein the mobile terminal may comprise a circuit according to some embodiments of the invention.

FIG. 5B illustrates a mobile terminal 520, which may comprise one or more circuits or perform methods according to embodiments of the invention. For example, the mobile terminal 520 may comprise any of the arrangements illustrated in FIGS. 2, 3A and 3B.

The described embodiments of the invention and their equivalents may be realised in software or hardware or a combination thereof. They may be performed by general-purpose circuits associated with or integral to a communication device, such as digital signal processors (DSP), central processing units (CPU), co-processor units, field-programmable gate arrays (FPGA) or other programmable hardware, by specialized circuits such as for example application-specific integrated circuits (ASIC), or by discrete electronic components. All such forms are contemplated to be within the scope of the invention.

The invention may be embodied within an electronic apparatus comprising circuitry/logic or performing methods according to any of the embodiments of the invention. The electronic apparatus may, for example, be a portable or hand-held mobile radio communication equipment, a mobile radio terminal, a mobile telephone, a base station, a pager, a communicator, an electronic organizer, a smartphone, a computer, a notebook, a mobile gaming device, or a base station.

The invention has been described herein with reference to various embodiments. However, a person skilled in the art would recognize numerous variations to the described embodiments that would still fall within the scope of the invention. For example, the method embodiments described herein describes example methods through method steps being performed in a certain order. However, it is recognized that these sequences of events may take place in another order without departing from the scope of the invention. Furthermore, some method steps may be performed in parallel even though they have been described as being performed in sequence.

In the same manner, it should be noted that in the description of embodiments of the invention, the partition of functional blocks into particular units is by no means limiting to the invention. Contrarily, these partitions are merely examples. Functional blocks described herein as one unit may be split into two or more units. In the same manner, functional blocks that are described herein as being implemented as two or more units may be implemented as a single unit without departing from the scope of the invention.

Hence, it should be understood that the limitations of the described embodiments are merely for illustrative purpose and by no means limiting. Instead, the scope of the invention is defined by the appended claims rather than by the description, and all variations that fall within the range of the claims are intended to be embraced therein.

The invention claimed is:

1. An interference reducing circuit for a radio frequency transmitter, wherein the radio frequency transmitter comprises:
an amplifier;
an antenna port;
an isolator configured to isolate an output of the amplifier from an interfering signal of the antenna port;
a transmission line comprising a first part, a second part and a third part, the first part comprising a first end connectable to a signal source and a second end coupled to an input of the amplifier, the second part comprising a third end coupled to the output of the amplifier and a fourth end coupled to an input of the isolator, the third part comprising a fifth end coupled to an output of the isolator and a sixth end coupled to the antenna port; and
a linearization loop configured to reduce a non-linearity of the isolator, the linearization loop comprising:
a first directional coupler coupled to the third part of the transmission line;

a loop impedance coupled at a first port to the first directional coupler; and at least one further linearization loop element coupled to a second port of the loop impedance via a loop feed line and configured to adjust a linearization signal and to feed the adjusted linearization signal to the transmission line; and wherein the interference reducing circuit is configured to reduce an influence of the interfering signal of the antenna port on the linearization loop and comprises:

a second directional coupler configured to extract a compensation signal from the third part of the transmission line;

a variable gain and phase shifter coupled at a first port to the third part of the transmission line via the second directional coupler and configured to:

adjust an amplitude of the compensation signal to match an amplitude of the interfering signal of the antenna port passing through the loop impedance; and adjust a phase of the compensation signal to be of opposite phase as the interfering signal of the antenna port passing through the loop impedance; and a third directional coupler coupling a second port of the variable gain and phase shifter to the loop feed line and configured to feed the adjusted compensation signal to the loop feed line.

2. The interference reducing circuit of claim 1, wherein the first and second directional couplers comprise a single directional coupler, and wherein the variable gain and phase shifter is coupled to the third part of the transmission line via an isolation port of the single directional coupler.

3. The interference reducing circuit of claim 1, wherein the variable gain and phase shifter comprises a variable gain shifter and a variable phase shifter coupled in series.

4. The interference reducing circuit of claim 1, wherein the interference reducing circuit is configured for a multi-carrier radio frequency transmitter.

5. The interference reducing circuit of claim 1, wherein the interference reducing circuit is configured in combination with the linearization loop as a compensation circuit.

6. The interference reducing circuit of claim 5, wherein the linearization loop is a feed forward loop.

7. The interference reducing circuit of claim 5, wherein the linearization loop is a feedback loop.

8. The interference reducing circuit of claim 5, wherein the linearization loop is further configured to reduce a non-linearity of the amplifier.

9. A radio frequency transmitter comprising:
an amplifier;
an antenna port;
an isolator configured to isolate an output of the amplifier from an interfering signal of the antenna port;
a transmission line comprising a first part, a second part and a third part, the first part comprising a first end connectable to a signal source and a second end coupled to an input of the amplifier, the second part comprising a third end coupled to the output of the amplifier and a fourth end coupled to an input of the isolator, the third part comprising a fifth end coupled to an output of the isolator and a sixth end coupled to the antenna port; and
a linearization loop configured to reduce a non-linearity of the isolator, the linearization loop comprising:
a first directional coupler coupled to the third part of the transmission line;
a loop impedance coupled at a first port to the first directional coupler; and
at least one further linearization loop element coupled to a second port of the loop impedance via a loop feed line and configured to adjust a linearization signal and to feed the adjusted linearization signal to the transmission line; and an interference reducing circuit configured to reduce an influence of the interfering signal of the antenna port on the linearization loop and comprising:

a second directional coupler configured to extract a compensation signal from the third part of the transmission line;

a variable gain and phase shifter coupled at a first port to the third part of the transmission line via the second directional coupler and configured to:

adjust an amplitude of the compensation signal to match an amplitude of the interfering signal of the antenna port passing through the loop impedance; and adjust a phase of the compensation signal to be of opposite phase as the interfering signal of the antenna port passing through the loop impedance; and a third directional coupler coupling a second port of the variable gain and phase shifter to the loop feed line and configured to feed the adjusted compensation signal to the loop feed line.

10. The radio frequency transmitter of claim 9, wherein the isolator comprises a circulator.

11. The radio frequency transmitter according to claim 9, wherein the radio frequency transmitter comprises part of a communication device.

12. The radio frequency transmitter according to claim 11, wherein the communication device is a radio base station or a mobile terminal.

13. An interference reduction method for a radio frequency transmitter, wherein the radio frequency transmitter comprises:
an amplifier;
an antenna port;
an isolator configured to isolate an output of the amplifier from an interfering signal of the antenna port;
a transmission line comprising a first part, a second part and a third part, the first part comprising a first end connectable to a signal source and a second end coupled to an input of the amplifier, the second part comprising a third end coupled to the output of the amplifier and a fourth end coupled to an input of the isolator, the third part comprising a fifth end coupled to an output of the isolator and a sixth end coupled to the antenna port; and
a linearization loop configured to reduce a non-linearity of the isolator, the linearization loop comprising:
a first directional coupler coupled to the third part of the transmission line;
a loop impedance coupled at a first port to the first directional coupler; and
at least one further linearization loop element coupled to a second port of the loop impedance via a loop feed line and configured to adjust a linearization signal and to feed the adjusted linearization signal to the transmission line; and wherein the interference reduction method reduces an influence of the interfering signal of the antenna port on the linearization loop and comprises:
extracting a compensation signal from the third transmission line via a second directional coupler;

adjusting an amplitude of the compensation signal to match an amplitude of the interfering signal of the antenna port passing through the loop impedance;

adjusting a phase of the compensation signal to be of opposite phase as the interfering signal of the antenna port passing through the loop impedance; and feeding the adjusted compensation signal to the loop feed line via a third directional coupler.

14. The interference reduction method of claim 13, wherein the first and second directional couplers comprise a single directional coupler, and wherein the step of extracting the compensation signal from the third transmission line vi the second directional coupler comprises extracting the compensation signal from an isolation port of the single directional coupler.

15. A method of manufacturing a radio frequency transmitter comprising:

coupling a signal source to an input of an amplifier via a first part of a transmission line;

arranging an isolator to isolate an output of the amplifier from an interfering signal of an antenna port by:
coupling the output of the amplifier to an input of the isolator via a second part of the transmission line; and
coupling an output of the isolator to the antenna port via a third part of the transmission line;

arranging a linearization loop to reduce a non-linearity of the isolator by:
coupling a first directional coupler to the third part of the transmission line;
coupling a loop impedance at a first port to the first directional coupler;
coupling at least one further linearization loop element to a second port of the loop impedance via a loop feed line; and
arranging the at least one further linearization loop element to adjust a linearization signal and to feed the adjusted linearization signal to the transmission line;

arranging an interference reducing circuit to reduce an influence of the interfering signal of the antenna port on the linearization loop by:
configuring a second directional coupler to extract a compensation signal from the third part of the transmission line;
coupling a variable gain and phase shifter at a first port to the third part of the transmission line via the second directional coupler;
configuring the variable gain and phase shifter to adjust an amplitude of the compensation signal to match an amplitude of the interfering signal of the antenna port passing through the loop impedance, and to adjust a phase of the compensation signal to be of opposite phase as the interfering signal of the antenna port passing through the loop impedance; and
coupling a second port of the variable gain and phase shifter to the loop feed line via a third directional coupler to feed the adjusted compensation signal to the loop feed line.

* * * * *